(12) United States Patent
Ouderkirk et al.

(10) Patent No.: US 11,022,856 B1
(45) Date of Patent: Jun. 1, 2021

(54) WAVEGUIDE WITH SWITCHABLE INPUT

(71) Applicant: Facebook Technologies, LLC, Menlo Park, CA (US)

(72) Inventors: Andrew John Ouderkirk, Redmond, WA (US); Wanli Chi, Sammamish, WA (US); Kenneth Diest, Kirkland, WA (US); Renate Eva Klementine Landig, Seattle, WA (US); Tanya Malhotra, Redmond, WA (US); Austin Lane, Bellevue, WA (US); Christopher Yuan Ting Liao, Seattle, WA (US); Katherine Marie Smyth, Seattle, WA (US); Jack Lindsay, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 180 days.

(21) Appl. No.: 16/263,829

(22) Filed: Jan. 31, 2019

Related U.S. Application Data

(60) Provisional application No. 62/777,825, filed on Dec. 11, 2018.

(51) Int. Cl.
*G02F 1/29* (2006.01)
*F21V 8/00* (2006.01)
*G02B 5/18* (2006.01)

(52) U.S. Cl.
CPC .......... *G02F 1/292* (2013.01); *G02B 5/1847* (2013.01); *G02B 6/0026* (2013.01)

(58) Field of Classification Search
CPC .. G02B 6/022; G02B 6/02204; G02B 5/1847; G02B 6/0026; G02F 1/0131; G02F 1/292
See application file for complete search history.

(56) References Cited

U.S. PATENT DOCUMENTS

| | | | |
|---|---|---|---|
| 5,095,515 A * | 3/1992 | Seaver | G01L 1/241 385/16 |
| 6,420,441 B1 | 7/2002 | Allen et al. | |
| 6,628,850 B1 | 9/2003 | Yao | |
| 7,230,771 B2 | 6/2007 | Kuiper et al. | |
| 8,477,402 B2 | 7/2013 | Duncan et al. | |
| 8,848,280 B2 * | 9/2014 | Arsenault | B42D 25/36 359/322 |
| 9,228,822 B2 | 1/2016 | Majidi et al. | |
| 10,670,782 B2 * | 6/2020 | Arbabi | G02B 27/0056 |

(Continued)

OTHER PUBLICATIONS

U.S. Appl. No. 16/351,477, filed Mar. 12, 2019.

(Continued)

*Primary Examiner* — Collin X Beatty
(74) *Attorney, Agent, or Firm* — FisherBroyles, LLP

(57) ABSTRACT

A display device includes a scanned projector for projecting a beam of light, and a diffraction grating for dispersing the light at a plurality of angles into a waveguide, wherein at least a portion of the diffraction grating includes a nanovoided polymer. Manipulation of the nanovoid topology, such as through capacitive actuation, can be used to reversibly control the effective refractive index of the nanovoided polymer and hence the grating efficiency. The switchable grating can be used to control the amount of diffraction of an incident beam of light through the grating thereby decreasing optical loss. Various other methods, systems, apparatuses, and materials are also disclosed.

18 Claims, 10 Drawing Sheets

(56) References Cited

U.S. PATENT DOCUMENTS

| | | | |
|---|---|---|---|
| 10,690,946 B2* | 6/2020 | Wilson | G01L 1/24 |
| 10,749,448 B2 | 8/2020 | Lindsay et al. | |
| 2002/0009251 A1 | 1/2002 | Byrne | |
| 2002/0135863 A1* | 9/2002 | Fukshima | G02F 1/292 |
| | | | 359/298 |
| 2002/0186928 A1 | 12/2002 | Curtis | |
| 2005/0196552 A1 | 9/2005 | Lehmann et al. | |
| 2006/0024976 A1 | 2/2006 | Waldfried et al. | |
| 2006/0028734 A1 | 2/2006 | Kuiper et al. | |
| 2007/0020404 A1 | 1/2007 | Seiberle et al. | |
| 2007/0263963 A1 | 11/2007 | Hughes et al. | |
| 2008/0137031 A1 | 6/2008 | Hillis et al. | |
| 2008/0171431 A1 | 7/2008 | Yu et al. | |
| 2008/0197518 A1 | 8/2008 | Aylward et al. | |
| 2008/0224103 A1 | 9/2008 | Arsenault et al. | |
| 2009/0034051 A1 | 2/2009 | Arsenault et al. | |
| 2009/0296188 A1 | 12/2009 | Jain et al. | |
| 2010/0075056 A1 | 3/2010 | Axisa et al. | |
| 2011/0149410 A1 | 6/2011 | Blum | |
| 2011/0242638 A1* | 10/2011 | Horning | B82Y 20/00 |
| | | | 359/290 |
| 2012/0019185 A1 | 1/2012 | Guidarelli et al. | |
| 2012/0029416 A1 | 2/2012 | Parker et al. | |
| 2012/0200931 A1 | 8/2012 | Haag et al. | |
| 2012/0298200 A1 | 11/2012 | Niggemann et al. | |
| 2013/0202867 A1 | 8/2013 | Coggio et al. | |
| 2013/0222881 A1* | 8/2013 | Aizenberg | B29D 11/0074 |
| | | | 359/291 |
| 2013/0279151 A1 | 10/2013 | Ouderkirk et al. | |
| 2013/0335807 A1* | 12/2013 | Arsenault | B82Y 20/00 |
| | | | 359/291 |
| 2014/0133010 A1* | 5/2014 | Han | G02F 1/0131 |
| | | | 359/296 |
| 2014/0204372 A1 | 7/2014 | Pang et al. | |
| 2014/0217539 A1 | 8/2014 | Rantala | |
| 2014/0234995 A1 | 8/2014 | Li et al. | |
| 2014/0266647 A1 | 9/2014 | Visitacion et al. | |
| 2015/0109657 A1* | 4/2015 | Baumberg | B42D 25/36 |
| | | | 359/291 |
| 2015/0205126 A1 | 7/2015 | Schowengerdt | |
| 2015/0241698 A1* | 8/2015 | Schowengerdt | G02B 6/34 |
| | | | 345/633 |
| 2015/0315012 A1 | 11/2015 | Wiersma et al. | |
| 2016/0103341 A1 | 4/2016 | Long et al. | |
| 2016/0187985 A1 | 6/2016 | Lim et al. | |
| 2016/0283773 A1* | 9/2016 | Popovich | G02B 6/0026 |
| 2017/0023807 A1* | 1/2017 | Chang-Hasnain | G02B 1/002 |
| 2017/0031078 A1 | 2/2017 | Thompson et al. | |
| 2017/0090570 A1 | 3/2017 | Rain et al. | |
| 2017/0192595 A1* | 7/2017 | Choi | G06F 3/0416 |
| 2017/0285348 A1* | 10/2017 | Ayres | G02B 5/18 |
| 2017/0365630 A1 | 12/2017 | Yang | |
| 2018/0093456 A1 | 4/2018 | Van Overmeere et al. | |
| 2018/0164627 A1* | 6/2018 | Oh | G02F 1/29 |
| 2018/0356303 A1 | 12/2018 | Li et al. | |
| 2019/0296218 A1 | 9/2019 | Ouderkirk et al. | |
| 2019/0361318 A1 | 11/2019 | Johnson et al. | |
| 2020/0076328 A1 | 3/2020 | Cha et al. | |
| 2020/0183168 A1 | 6/2020 | Spann et al. | |
| 2020/0183199 A1 | 6/2020 | Diest et al. | |
| 2020/0183200 A1 | 6/2020 | Diest et al. | |
| 2020/0185590 A1 | 6/2020 | Malhotra et al. | |

OTHER PUBLICATIONS

U.S. Appl. No. 16/426,737, filed May 30, 2019.

U.S. Appl. No. 16/512,335, filed Jul. 15, 2019.

Moore, Duncan T., "Gradient Index Optics", Optical Elements, IVPV Handbook of Optics, 2nd Edition, vol. II—Devices, Measurements, and Properties, 1995, pp. 9.1-9.10.

Nguyen et al., "Synthesis, Processing, and Characterization of Inorganic-Organic Hybrid Cross-Linked Silica, Organic Polyimide, and Inorganic Aluminosilicate Aerogels", National Aeronautics and Space Administration STI Program, NASA/CR-2014-218328, Jul. 2014, 58 pages.

Shatz, Narkis, "Gradient-Index Optics", Science Applications International Corp., Final Report, Mar. 31, 2010, 103 pages.

Teichman et al., "Gradient Index Optics at DARPA", Institute for Defense Analyses, IDA Document D-5027, Nov. 2013, 69 pages.

Tanaka et al., "Polymer Nanocomposites as Dielectrics and Electrical Insulation-perspectives for Processing Technologies, Material Characterization and Future Applications", IEEE Transactions on Dielectrics and Electrical Insulation, vol. 11, No. 5, Oct. 2004, pp. 763-784.

Matyka et al., "How to Calculate Tortuosity Easily?", AIP Conference Proceedings, Mar. 26, 2012, 6 pages.

Cheng et al., "Controlled in Situ Nanocavitation in Polymeric Materials", Advanced Materials, vol. 23, Jan. 2011, pp. 409-413.

Solans et al., "Nano-emulsions: Formation by low-energy methods", Colloid & Interface Science, vol. 17, Issue 5, Oct. 2012, pp. 246-254.

Fuse et al., "Possible Mechanism of Superior Partial-Discharge Resistance of Polyamide Nanocomposites", Annual Report Conference on Electrical Insulation and Dielectric Phenomena, 2004, pp. 322-325.

Wu et al., "3D Printed Silicones with Shape Memory", Scientific Reports, vol. 7, No. 4664, Jul. 5, 2017, pp. 1-6.

Johnson et al., "A brief review of atomic layer deposition:from fundamentals to applications", Materials Today, vol. 17, No. 5, Jun. 2014, pp. 236-246.

Sole et al., "Nano-emulsions prepared by the phase inversion composition method: Preparation variables and scale up", Journal of Colloid and Interface Science, vol. 344, 2010, pp. 417-423.

Camino et al., "Polydimethylsiloxane thermal degradation Part 1. Kinetic aspects", Polymer, vol. 42, 2001, pp. 2395-2402.

Tanaka et al., "Proposal of a Multi-core Model for Polymer Nanocomposite Dielectrics", IEEE Transactions on Dielectrics and Electrical Insulation, vol. 12, No. 4, Aug. 2005, pp. 669-681.

Loiko et al., "Experimental results and theoretical model to describe angular dependence of light scattering by monolayer of nematic droplets", Journal of Quantitative Spectroscopy and Radiative Transfer, vol. 178, Jul. 2016, 11 pages.

Dickson et al., "Electronically Controlled Surface Plasmon Dispersion and Optical Transmission through Metallic Hole Arrays Using Liquid Crystal", Nano Letters, vol. 8, No. 1, Jan. 1, 2008, pp. 281-286.

Diest et al., "Nanovoided Tunable Optics", U.S. Appl. No. 16/262,439, filed Jan. 30, 2019, 57 pages.

Ouderkirk et al., "Nanovoided Graded-Index Optical Elements, Optical Arrays, and Methods of Forming the Same", U.S. Appl. No. 16/426,737, filed May 30, 2019, 113 pages.

Diest et al., "Polymer Materials Including Coated Nanovoids and Methods and Systems for Forming the Same", U.S. Appl. No. 16/512,335, filed Jul. 15, 2019, 133 pages.

Sharma et al., "Switchable Electroactive Devices for Head-Mounted Displays", U.S. Appl. No. 16/351,477, filed Mar. 12, 2019, 108 pages.

Spann et al., "Nanovoided Polymers Having Shaped Voids", U.S. Appl. No. 16/703,674, filed Dec. 4, 2019, 149 pages.

Landig et al., "Planarization Layers for Nanovoided Polymers", U.S. Appl. No. 16/364,977, filed Mar. 26, 2019, 125 pages.

International Search Report and Written Opinion received for PCT Application Serial No. PCT/US2019/064367 dated Mar. 11, 2020, 17 pages.

Landig et al., "Multiple Layers Between Electrodes Including Nanovoided Polymer", U.S. Appl. No. 16/386,232, filed Apr. 16, 2019, 126 pages.

Landig et al., "Nanovoided Polymers Using Phase Inversion", U.S. Appl. No. 16/449,964, filed Jun. 24, 2019, 139 pages.

Spann et al., "Reduced Hysteresis and Reduced Creep in Nanovoided Polymer Devices", U.S. Appl. No. 16/703,291, filed Dec. 4, 2019, 152 pages.

Diest et al., "Nanovoided Tunable Birefringence", U.S. Appl. No. 16/262,433, filed Jan. 30, 2019, 51 pages.

Malhotra et al., "Spatially Addressable Nanovoided Polymers", U.S. Appl. No. 16/417,911, filed May 21, 2019, 138 pages.

(56) References Cited

OTHER PUBLICATIONS

Landig et al., "Fabrication of Shaped Voids", U.S. Appl. No. 16/669,970, filed Oct. 31, 2019, 110 pages.
International Search Report and Written Opinion received for PCT Application Serial No. PCT/US2019/064395 dated Mar. 12, 2020, 17 pages.
Si et al., "Liquid-Crystal-Enabled Active Plasmonics: A Review", Materials, vol. 7, No. 2, Feb. 18, 2014, pp. 1296-1317.
Crawford, Gregory P., "Electrically Switchable Bragg Gratings", Optics & Photonics News, Apr. 30, 2003, pp. 54-59.
Non-Final Office Action received for U.S. Appl. No. 16/351,477 dated Jun. 23, 2020, 27 pages.
Fratzl et al., "The mechanics of tessellations—bioinspired strategies for fracture resistance", Chem Soc Rev., vol. 45, No. 2, Jan. 21, 2016, pp. 252-267.
Gohtani et al., "Nano-Emulsions; Emulsification Using Low Energy Methods", Japan Journal of Food Engineering, vol. 15, No. 3, Sep. 1, 2014, pp. 119-130.
Michler et al., "The physics and micro-mechanics of nano-voids and nano-particles in polymer combinations", ScienceDirect, Polymer, vol. 54, No. 13, Jun. 7, 2013, pp. 1-14.
Zhu et al., "Large deformation and electromechanical instability of a dielectric elastomer tube actuator", Journal of Applied Physics, vol. 108, Issue 7, Article 074113, Oct. 13, 2010, pp. 1-6.
Cameron et al., "Linear actuation in coextruded dielectric elastomer tubes", ScienceDirect, Sensors and Actuators A: Physical, vol. 147, Issue 1, Sep. 15, 2008, pp. 286-291.
Catmull et al., "Recursively generated B-spline surfaces on arbitrary topological meshes", Computer-Aided Design, vol. 10, No. 6, Nov. 1, 1978, pp. 183-188.
Loop, Charles Teorell, "Smooth Subdivision Surfaces Based on Triangles", Thesis, Master of Science, University of Utah, Aug. 1, 1987, 74 pages.
Merkel et al., "Gas Sorption, Diffusion, and Permeation in Poly(dimethylsiloxane)", Journal of Polymer Science: Part B: Polymer Physics, vol. 38, Feb. 1, 2000, pp. 415-434.
Kim et al., "Mathematical analysis of oxygen transfer through polydimethylsiloxane membrane between double layers of cell culture channel and gas chamber in microfluidic oxygenator", Microfluidics and Nanofluidics, vol. 15, Feb. 1, 2013, 39 pages.
Cruz-Hernandez et al., "Phase Control Approach to Hysteresis Reduction", IEEE Transactions on Control Systems Technology, vol. 9, No. 1, Jan. 1, 2001, pp. 17-26.
Zuev, Yu.S., "Elastomer-gas systems", International Polymer Science and Technology, vol. 28, No. 2, Feb. 1, 2001, pp. 43-53.
Shir, Daniel Jay-Lee et, "Three-Dimensional Nanofabrication with Elastomeric Phase Masks", PhD Thesis, University of Illinois at Urbana-Champaign, Oct. 17, 2007, 138 pages.
Jeon et al., "Three dimensional nanoporous density graded materials formed by optical exposures through conformable phase masks", Applied Physics Letters, vol. 89, Article 253101, Dec. 18, 2006, pp. 1-3.
Sultan et al., "Electrical Breakdown Testing of Materials Intended for use in PV Modules", 3rd Atlas/NIST Workshop on Photovoltaics, Dec. 8-9, 2015, 29 pages.
Sekitani et al., "Stretchable active-matrix organic light-emitting diode display using printable elastic conductors", Nature Materials, vol. 8, May 10, 2009, pp. 494-499.
Someya et al., "Conformable, flexible, large-area networks of pressure and thermal sensors with organic transistor active matrixes", PNAS, vol. 102, No. 35, Aug. 30, 2005, pp. 12321-12325.
Wegener et al., "Controlled inflation of voids in cellular polymer ferroelectrets: Optimizing electromechanical transducer properties", Applies Physics Letters, vol. 84, No. 3, Jan. 19, 2004, pp. 392-394.
Wu et al., "Fabrication of ultralong perovskite structure nanotubes", RSC Advances, vol. 8, Jan. 2, 2018, pp. 367-373.
Wu et al., "Efficient multi-barrier thin film encapsulation of OLED using alternating Al2O3 and polymer layers", RSC Advances, vol. 8, Feb. 2, 2018, pp. 5721-5727.
Yang et al., "Harnessing Surface Wrinkle Patterns in Soft Matter", Advanced Functional Materials, vol. 20, Jul. 29, 2010, pp. 2550-2564.
Zhang et al., "Highly Porous Polyhedral Silsesquioxane Polymers. Synthesis and Characterization", J. Am. Chem. Soc., vol. 120, Aug. 11, 1998, pp. 8380-8391.
Yang et al., "Avoiding the pull-in instability of a dielectric elastomer film and the potential for increased actuation and energy harvesting", Soft Matter, vol. 13, Jan. 6, 2017, pp. 4552-4558.
Jang et al., "Mechanically Tunable Three-Dimensional Elastomeric Network/Air Structures via Interference Lithography", Nano Letters, vol. 6, No. 4, Mar. 15, 2006, pp. 740-743.
Rogers et al., "Materials and Mechanics for Stretchable Electronics", Science, vol. 327, Mar. 26, 2010, pp. 1603-1607.
Wolak et al., "Dielectric response of structured multilayered polymer films fabricated by forced assembly", Applied Physics Letters, vol. 92, Article 113301, Mar. 17, 2008, pp. 1-3.
Mackey et al., "Enhanced breakdown strength of multilayered films fabricated by forced assembly microlayer coextrusion", Journal of Physics D: Applied Physics, vol. 42, Article 175304, Aug. 12, 2009, pp. 1-12.
Ieda, Masayuki, "Dielectric Breakdown Process of Polymers", IEEE Transactions on Electrical Insulation, vol. El-15, No. 3, Jun. 1980, pp. 206-224.
Mullin et al., "Pattern Transformation Triggered by Deformation", Physical Review Letters, vol. 99, No. 8, 2007, 4 pages.
Babaee et al., "3D Soft Metamaterials with Negative Poisson's ratio", Advanced Materials, vol. 25, No. 36, 2013, 18 pages.
Bertoldi et al., "Novel negative Poisson's ratio behavior induced by an elastic instability", Advanced Materials, vol. 22, No. 3, 2010, pp. 1-11.
Overvelde et al., "Relating pore shape to the non-linear response of periodic elastomeric structures", Journal of the Mechanics and Physics of Solids, vol. 64, 2014, 16 pages.
Shen et al., "Simple cubic three-dimensional auxetic metamaterials", Physic. Status Solidi (B), vol. 251, No. 8, 2014, pp. 1515-1522.
Correa et al., "Negative Stiffness Honeycombs for Recoverable Shock Isolation", Rapid Prototyping Journal, vol. 21, No. 2, 2015, pp. 702-713.
Coulais et al., "Discontinuous Buckling of Wide Beams and Metabeams", Physical Review Letters, vol. 115, 2015, 7 pages.
Bickel et al., "Design and Fabrication of Materials with Desired Deformation Behavior", ACM Transactions on Graphics (TOG), vol. 29, No. 4, Jul. 2010, 10 pages.
Rosset et al., "Small, fast, and tough: Shrinking down integrated elastomer transducers", Applied Physics Reviews, vol. 3, No. 3, 2016, pp. 1-27.
Plante et al., "Large-scale failure modes of dielectric elastomer actuators", International Journal of Solids and Structures, vol. 43, 2006, pp. 7727-7751.
"Optotune DEAPs", Electroactive polymers, URL: https://www.optotune.com/technology/electroactive-polymers, 2019, 3 pages.
Product—Novasentis, "EMP Haptic Actuators for Sensory Innovation", URL: https://www.novasentis.com/product, 2019, 4 pages.
Rosset et al., "Mechanical characterization of a dielectric elastomer microactuator with ion-implanted electrodes", Sensor and Actuators A 144, 2008, 25 pages.
Gerratt et al., "Dielectric breakdown of PDMS thin films", Journal of Micromechanics and Microengineering, vol. 23, Apr. 26, 2013, 8 pages.
Hunt et al., "A self-healing dielectric elastomer actuator", Applied Physics Letters, vol. 104, 2014, 4 pages.
Skov et al., "Optimization Techniques for Improving the Performance of Silicone-Based Dielectric Elastomers", Advanced Engineering Materials, vol. 20, 2018, pp. 1-21.
Mazurek et al., "Glycerol as high-permittivity liquid filler in dielectric silicone elastomers", Journal of Applied Polymer Science, vol. 133, No. 43, 2016, 28 pages.
Rao et al., "Synthesis of flexible silica aerogels using methyltrimethoxysilane (MTMS) precursor", Journal of Colloid and Interface Science, vol. 300, 2006, pp. 279-285.

(56) References Cited

OTHER PUBLICATIONS

Seo et al., "Reticulated Nanoporous Polymers by Controlled Polymerization-Induced Microphase Separation", Science, vol. 336, Jun. 15, 2012, 5 pages.
Jennings, S.G., "The mean free path in air", Journal of Aerosol Science, vol. 19, No. 2, 1988, pp. 1-2.
Gupta et al., "Nanoemulsions: formation, properties and applications", Soft Matter, 2016, 16 pages.
Helgeson et al., "Mesoporous organohydrogels from thermogelling photocrosslinkable nanoemulsions", Nature Materials, vol. 11, Apr. 2012, pp. 344-352.
Guha et al., "Creating nanoscale emulsions using condensation", Nature Communications, 8:1371, 2017, pp. 1-7.
Meier et al., "Microemulsion elastomers", Colloid Polymer Science, vol. 274, 1996, pp. 218-226.
Richter et al., "Design considerations of form birefringent microstructures", Applied Optics, vol. 34, No. 14, May 10, 1995, pp. 2421-2429.
Mahadik et al., "Elastic and Superhydrophobic Monolithic Methyltrimethyoxysilane-based Silica Aerogels by Two-step sol-gel process", Journal Microelectron, vol. 23, No. 1, 2016, pp. 35-39.
Waldem et al., "DigiLens Switchable Bragg grating waveguide optics for augmented reality applications", Proc. SPIE 10676, Digital optics for Immersive Displays, May 21, 2018, 1 page.
Non-Final Office Action received for U.S. Appl. No. 16/364,977 dated Oct. 19, 2020, 38 pages.
Preinterview first office action received for U.S. Appl. No. 16/262,439 dated Nov. 30, 2020, 42 pages.
Final office action received for U.S. Appl. No. 16/351,477 dated Dec. 1, 2020, 38 pages.
Non-Final office action received for U.S. Appl. No. 16/449,964 dated Nov. 24, 2020, 91 pages.
Holda et al., "Understanding and guiding the phase inversion process for synthesis of solvent resistant nanofiltration membranes", J. Appl. Polym. Sci., 42130, 2015, 17 pages.
Struzynska-Piron et al., "Synthesis of solvent stable polymeric membranes via UV depth-curing", Chem. Commun., vol. 49, 11494, 2013, 3 pages.
Preinterview first office action received for U.S. Appl. No. 16/262,433 dated Oct. 26, 2020, 58 pages.
Notice of Allowance received for U.S. Appl. No. 16/364,977 dated Feb. 2, 2021, 40 pages.
Notice of Allowance received for U.S. Appl. No. 16/449,964 dated Mar. 4, 2021, 21 pages.
First Action Interview received for U.S. Appl. No. 16/262,433 dated Mar. 1, 2021, 12 pages.
Notice of Allowance received for U.S. Appl. No. 16/262,439 dated Apr. 6, 2021, 38 pages.
Notice of Allowance received for U.S. Appl. No. 16/351,477 dated Mar. 29, 2021, 28 pages.

* cited by examiner

WAVEGUIDE WITH SWITCHABLE INPUT

CROSS-REFERENCE TO RELATED APPLICATION

This application claims the benefit of priority under 35 U.S.C. § 119(e) of U.S. Provisional Application No. 62/777,825, filed Dec. 11, 2018, the contents of which are incorporated herein by reference in their entirety.

BACKGROUND

The present disclosure relates generally to waveguide displays, and more specifically to near-eye display systems. Near-eye light field displays may be used to project images directly into a user's eye, encompassing both near-eye displays (NEDs) and electronic viewfinders. Conventional near-eye displays (NEDs) typically have a display element that generates image light using a multicolored pixel array (including, e.g., red, green, and blue pixels) that passes through one or more lenses before reaching the user. The image light may be propagated laterally by a waveguide or other optical system so that the display element and the user's eye do not need to be aligned directly. Such waveguide displays may be used in head mounted displays (HMDs), for example, which may advantageously provide a large eye box, low pupil swim, and a thin form factor.

Undesirably, a number of loss mechanisms are typically associated with waveguide displays, including losses that accompany different positions, light ray angles, and wavelengths. These and other loss mechanisms can result in low system efficiency and color non-uniformity. One particular loss mechanism is associated with the input (i.e., diffraction) grating that couples light from a projector to be totally internally reflected within the waveguide. Notwithstanding recent developments, it would be advantageous to provide an improved input grating architecture that increases waveguide efficiency and improves color uniformity, without compromising performance or limiting the field of view of the display.

SUMMARY

As will be described in greater detail below, the present disclosure relates to an optical grating, such as a grating adapted for use as an input grating for a waveguide display. According to various embodiments, a nanovoided material is incorporated into at least a portion of the grating. Manipulation of the nanovoid topology, such as through capacitive actuation, can be used to reversibly control the effective refractive index of the nanovoided polymer layer and hence the grating efficiency. Thus, disclosed is a switchable input grating that can be used to control the amount of diffraction of an incident beam of light and decrease the amount of optical loss.

In accordance with some embodiments, a display device may include a scanned projector for projecting a beam of light and a diffraction grating for dispersing the beam of light at a plurality of angles into a waveguide. The diffraction grating may be optically coupled to the waveguide, for example. In various embodiments, at least a portion of the diffraction grating includes a nanovoided polymer.

The diffraction grating may include a far-side region overlying one end of the waveguide and a near-side region overlying the waveguide and laterally adjacent to the far-side region where at least one of the far-side region and the near-side region includes the nanovoided polymer. In various embodiments, the far-side region and the near-side region each include the nanovoided polymer.

The display device may further include a primary electrode and a secondary electrode overlapping at least a portion of the primary electrode where the nanovoided polymer is disposed between and abuts the primary electrode and the secondary electrode. As will be appreciated, actuation (i.e., compression) of the nanovoided polymer can change (i.e., increase or decrease) a diffraction efficiency of the diffraction grating, which can be used to decrease optical losses through the diffraction grating. In certain embodiments, the induced change in the void topology and hence the change in the diffraction efficiency may be reversible. A further display device may include an optical waveguide and a diffraction grating for dispersing a projected beam of light at a plurality of angles into the waveguide, where at least a portion of the diffraction grating includes a nanovoided polymer.

An example method of forming and operating such a display device includes forming a waveguide and forming a diffraction grating for dispersing a beam of light at a plurality of angles into the waveguide, such that at least a portion of the diffraction grating includes a nanovoided polymer. The method further includes compressing the nanovoided polymer to change an amount of the dispersed light totally internally reflected within the waveguide.

In conjunction with the foregoing, various other systems, apparatuses, methods, and materials are also disclosed. Features from any of the these or other embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
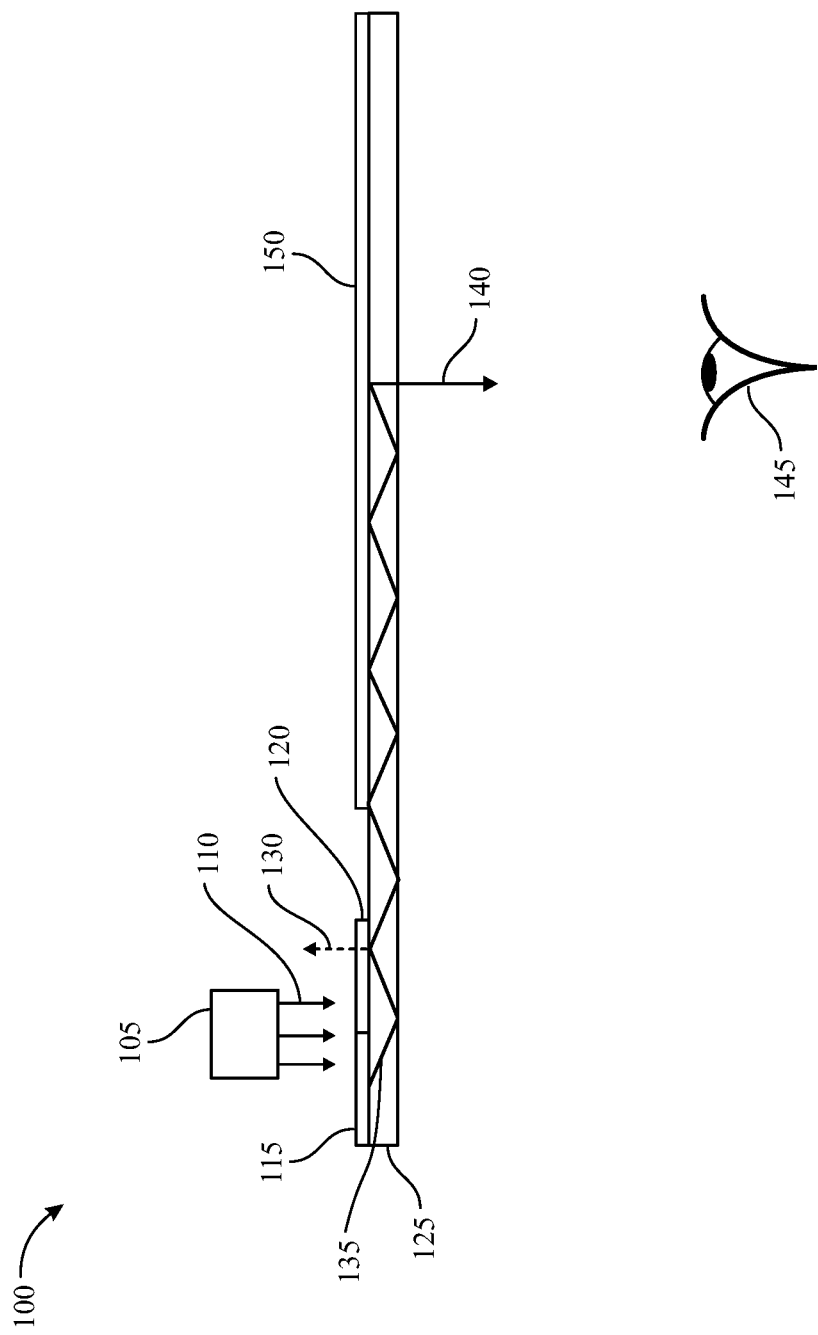
FIG. 1 is a schematic illustration of an example single waveguide display according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to a waveguide display having an input grating with a variable diffraction efficiency. Particular embodiments of the instant disclosure relate to switchable gratings that include a nanovoided polymer layer. Capacitive actuation, mechanical actuation, or actuation of the nanovoided polymer by other methods, such as by using an acoustic wave, may be used to reversibly manipulate the void topology within a nanovoided polymer layer and thereby adjust the diffraction efficiency of the grating. In particular, spatially-localized tuning of the diffraction efficiency of an input grating may be used to decrease the loss of diffracted light previously coupled into a waveguide back through the input grating.

Nanovoided polymers, which form the actuatable component of various waveguide displays as disclosed herein, represent a class of optical materials where the index of refraction can be tuned over a range of values to advantageously control the interaction of these materials with light. Nanovoided polymers may be distinguished from many traditional optical materials that may have either a static index of refraction or an index that can be switched between two static states.

In accordance with various embodiments, a nanovoided polymer material may include a polymer matrix and a plurality of nanoscale voids dispersed throughout the matrix. For example, the polymer matrix material may include a deformable, electroactive polymer that may be symmetric with regard to electrical charge (e.g., polydimethylsiloxane (PDMS), acrylates, etc.) or asymmetric (e.g., poled polyvinylidene fluoride (PVDF) or its co-polymers such as poly (vinylidenefluoride-co-trifluoroethylene) (PVDF-TrFE)).

In some examples, the terminology "nanovoids," "nanoscale voids," "nanovoided," and the like, may refer to voids having at least one sub-micron dimension, i.e., a length and/or width and/or depth, of less than 1000 nm. In some embodiments, the void size may be between approximately 10 nm and approximately 1000 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, or approximately 1000 nm, including ranges between any of the foregoing values).

In example nanovoided polymers, the nanovoids may be randomly distributed throughout the polymer matrix, without exhibiting any long-range order, or the nanovoids may exhibit a regular, periodic structure having a unit cell dimension of approximately 20 nm to approximately 1000 nm. Alternatively, the nanovoids may have a predetermined structure, such as the type of structure formed by interference volume or surface gratings. In both disordered and ordered structures, the nanovoids may be discrete, closed-celled voids, open-celled voids that may be at least partially interconnected, bi-continuous voids, or combinations thereof. For open-celled voids, the void size (d) may be the minimum average dimension of the cell. The voids may be any suitable size and, in some embodiments, the voids may approach the scale of the thickness of the nanovoided polymer layer.

In certain embodiments, the nanovoids in a nanovoided region of the polymer matrix may occupy approximately 10% to approximately 75% by volume of the polymer matrix, e.g., approximately 10%, approximately 20%, approximately 30%, approximately 40%, approximately 50%, approximately 60%, approximately 70%, or approximately 75%, including ranges between any of the foregoing values.

According to some embodiments, the nanovoids may be substantially spherical, although the void shape is not particularly limited. For instance, in addition to, or in lieu of spherical voids, the nanovoided polymer material may include voids that are oblate, prolate, lenticular, ovoid, etc., and may be characterized by a convex and/or a concave cross-sectional shape. Moreover, the topology of the voids throughout the polymer matrix may be uniform or non-uniform. As used herein, the term "topology," with reference to the nanovoids, may refer to their overall arrangement within the nanovoided polymer and may include their size and shape as well as their respective distribution (density, periodicity, etc.) throughout the polymer matrix. By way of example, the size of the voids and/or the void size distribution may vary spatially within the nanovoided polymer material, i.e., laterally and/or with respect to the thickness of the nanovoided polymer material.

In the presence of an electrostatic field (E-field), an electroactive polymer may deform (e.g., compress, elongate, bend, etc.) according to the magnitude and direction of the applied field. Generation of such a field may be accomplished, for example, by placing the electroactive polymer between two electrodes, i.e., a primary electrode and a secondary electrode, each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

The physical origin of the compressive nature of electroactive polymers in the presence of an electrostatic field, being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance in this case is the change of strain with respect to stress or, equivalently, in more practical terms, the change in displacement with respect to force.

In some embodiments, applying a voltage to the electrodes (e.g., the primary electrode and/or the secondary electrode) may create at least approximately 10% strain (e.g., an amount of deformation in the direction of the applied force resulting from the applied voltage divided by the initial dimension of the material) in the nanovoided polymer material in at least one direction (e.g., an x, y, or z direction with respect to a defined coordinate system).

In some embodiments, the nanovoids may be filled with a gas to suppress electrical breakdown of the electroactive polymer element (for example, during capacitive actuation). The gas may include air, nitrogen, oxygen, argon, sulfur hexafluoride, an organofluoride and/or any other suitable gas. In some embodiments, such a gas may have a high dielectric strength.

In some embodiments, the application of a voltage to a nanovoided polymer may change the internal pressure of gasses within the nanovoided regions thereof. For example, gasses may diffuse either into or out of the nanovoided polymer during dimensional changes associated with its deformation. Such changes in the electroactive polymer elements can affect, for example, the hysteresis of an electroactive device incorporating the electroactive polymer during dimensional changes, and also may result in drift when the nanovoided polymer's dimensions are rapidly changed.

In some embodiments, the nanovoided polymer material may include an elastomeric polymer matrix having an elastic modulus of less than approximately 10 GPa (e.g., approximately 10 GPa, approximately 5 GPa, approximately 2 GPa, approximately 1 GPa, approximately 0.5 GPa, approximately 0.2 GPa, approximately 0.1 GPa, or approximately 0.05 GPa, including ranges between any of the foregoing values).

Polymer materials including voids having nanoscale dimensions may possess a number of advantageous attributes. For example, nanovoided polymers may exhibit a higher transmission of visible light than their larger voided counterparts. Also, the incorporation of nanovoids into a polymer matrix may increase the permittivity of the resulting composite. Furthermore, the high surface area-to-volume ratio associated with nanovoided polymers will provide a greater interfacial area between the nanovoids and the surrounding polymer matrix. With such a high surface area structure, electric charge can accumulate at the void-matrix interface, which can enable greater polarizability and, consequently, increased permittivity ($\varepsilon r$) of the composite. Additionally, because ions, such as plasma electrons, can only be accelerated over small distances within nanovoids, the likelihood of molecular collisions that liberate additional ions and create a breakdown cascade is decreased, which may result in the nanovoided material exhibiting a greater breakdown strength (i.e., dielectric strength) than un-voided or even macro-voided dielectrics.

In addition to the foregoing, the following will provide, with reference to FIGS. 1-11, a detailed description of methods and systems related to the manufacture and operation of waveguide displays having a switchable input grating. The input grating may include one or more nanovoided polymer layers. The discussion associated with FIG. 1 includes a description of a single waveguide display having a segmented input grating. The discussion associated with FIG. 2 includes a description of an example stacked waveguide display where each waveguide includes a segmented input grating. The discussion associated with FIGS. 3 and 4 describes the formation and actuation of an input grating including a nanovoided polymer layer. The discussion associated with FIGS. 5-7 relates to scanned projector coupling to waveguide displays through different input grating geometries and the associated reflected light path within the respective waveguides. The discussion associated with FIGS. 8 and 9 describes the operation of a stacked waveguide display for different configurations of actuated versus un-actuated nanovoided polymer-containing input grating geometries. The discussion associated with FIGS. 10 and 11 describes the structure and actuation of a further example input grating including a nanovoided polymer.

Referring to FIG. 1, shown is a schematic illustration of an example waveguide display. Waveguide display 100 includes a scanned projector 105 configured to emit a ray bundle 110 into each of a first input grating 115 and a second input grating 120 that overlie and are optically coupled to waveguide 125. In some embodiments, first input grating 115 and second input grating 120 may be co-extensive. Waveguide 125 may be a planar waveguide and may be configured to relay optically-transmitted information, e.g., image information, by total internal reflection (TIR). As used herein, a light beam may be regarded as a "bundle" of individual light rays that are traveling parallel to each other.

In some embodiments, the scanned projector 105 may form a single or multi-dimensional image, for example, by sweeping a micro-LED array or by sweeping the output of a laser. In some embodiments, the scanned projector 105 may form two or more images (e.g., left and right fields of view), which may be displayed time sequentially. Such plural images may be at least partially overlapped to lessen the formation of certain projection artifacts.

In addition to the foregoing, in accordance with certain embodiments, the scanned projector 105 may form a monochromatic image or a multi-color image. For multi-color images, the different wavelengths of light may be generated simultaneously or sequentially.

During operation, first and second input gratings 115, 120 may couple projected light 110 into the waveguide 125 forming a diffracted ray bundle 135. At least a portion of the diffracted ray bundle 135 may interact with one or both of the first and second input gratings 115, 120, however, extracting a portion of the diffracted ray bundle 135 to form an undesired ray bundle 130. The remaining portion of the diffracted ray bundle 135 may be extracted by output grating 150 to form an image 140 visible to the user's eye 145. As will be appreciated, the formation of undesired ray bundle 130 may decrease the efficiency and/or lessen the color uniformity of waveguide display 100.

As will be explained in further detail herein, according to certain embodiments, the effective refractive index of the first input grating 115 may be different than the effective refractive index of the second input grating 120. For instance, a step-wise change in refractive index may be made between the first input grating 115 and the second input grating 120. Alternatively, a continuous index modulation change may be made between the two gratings, which may decrease the propensity for the formation of certain display image artifacts. A continuous, smooth grating profile change may be realized by controlling the topology of nanovoids within the nanovoided polymer material included within the gratings 115, 120, and/or by actuating selected regions of the nanovoided polymer material. By way of example, according to some embodiments, a spatially varying voltage may be applied to the nanovoided polymer within either or both of the input gratings 115, 120.

As used herein, an "effective refractive index" for a composite material such as a nanovoided polymer may not be a property of the material per se, but may be determined as a weighted average of the refractive indices of the constituent elements that constitute the composite, i.e., the polymer matrix and air. Such a determination may be made using effective medium theory, for example, as known to those skilled in the art.

Figure 2:
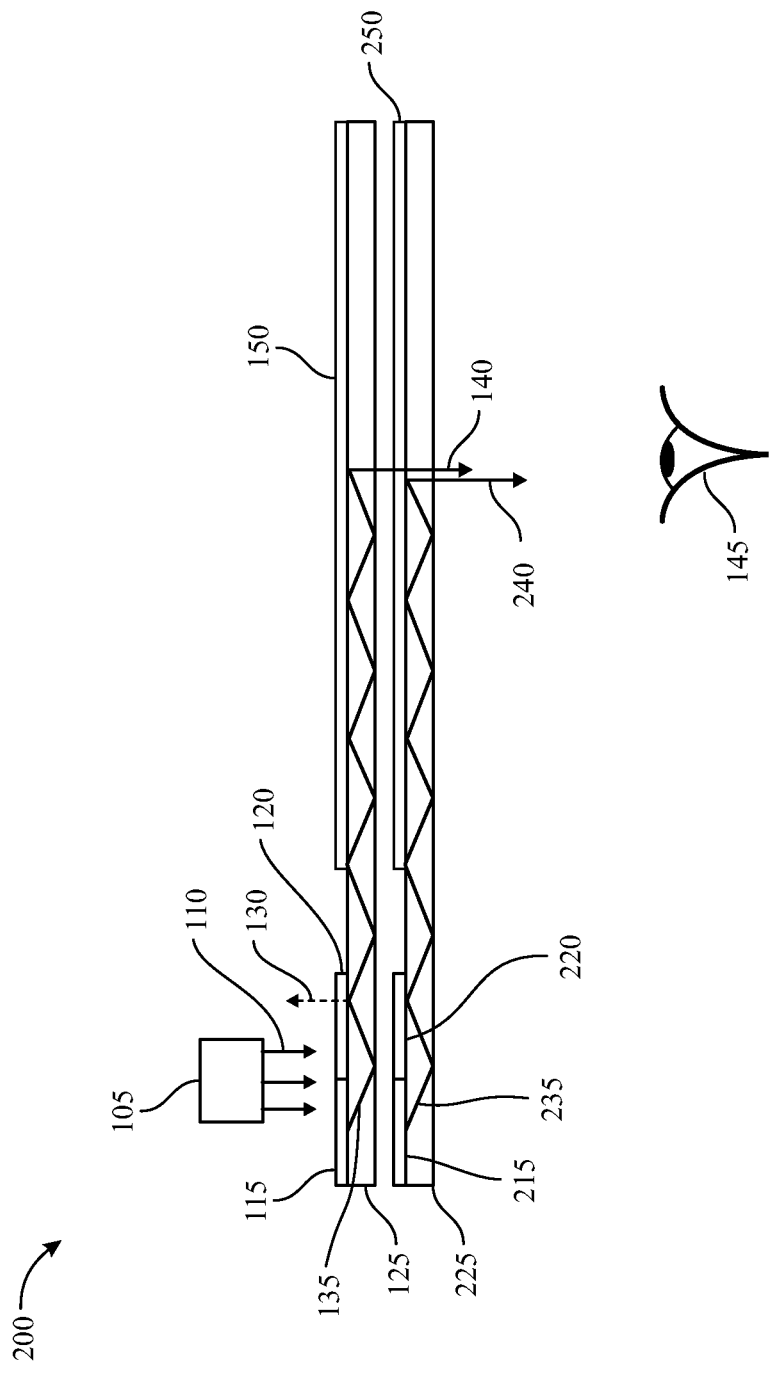
FIG. 2 is a schematic illustration of an example stacked waveguide display according to some embodiments.

Referring to FIG. 2, illustrated is a waveguide display according to further embodiments. Stacked waveguide display 200 includes a primary waveguide 125 overlying a secondary waveguide 225. In certain embodiments, primary waveguide 125 and secondary waveguide 225 may each be a planar waveguide. Stacked waveguide display 200 further includes a scanned projector 105 configured to emit a ray bundle 110 into each of a first primary input grating 115 and a second primary input grating 120 that overlie primary waveguide 125, and a first secondary input grating 215 and a second secondary input grating 220 that overlie secondary waveguide 225. In some embodiments, the first primary input grating 115 and the second primary input grating 120 are optically coupled to primary waveguide 125, and the first secondary input grating 215 and the second secondary input grating 220 are optically coupled to secondary waveguide 225. Waveguides 125, 225 are configured to relay optically-transmitted information contained in ray bundle 110, e.g., image information, by total internal reflection (TIR).

First and second primary input gratings 115, 120 may couple at least a portion of the projected light 110 into the primary waveguide 125 forming a primary diffracted ray bundle 135, and first and second secondary input gratings 215, 220 may couple at least a portion of the projected light 110 into the secondary waveguide 225 forming a secondary diffracted ray bundle 235.

As in the embodiment described with reference to FIG. 1, and as illustrated schematically in FIG. 2, a portion of one of the diffracted bundles (e.g., diffracted ray bundle 135) may interact with one or more input gratings (e.g., second primary input grating 120), resulting in the extraction of a portion of the diffracted ray bundle 135 to form undesired ray bundle 130. The remaining portion of the diffracted ray bundle 135 may be extracted by primary output grating 150 to form an image 140 visible to the user's eye 145. Likewise, the diffracted ray bundle 235 may be extracted by secondary output grating 250 to form an image 240 visible to the user's eye 145.

As will be appreciated, the reduction or elimination of an undesired ray bundle 130, which may emanate from one or both of primary waveguide 125 or secondary waveguide 225, may beneficially improve the efficiency and/or color uniformity of the stacked waveguide display 200. Thus, in accordance with various embodiments, a switchable input grating may be incorporated into the stacked waveguide display and used to modulate the optical intensity of light, e.g., ray bundle, transmitted or reflected by the input grating(s). As disclosed in further detail herein, example switchable input gratings include a nanovoided polymer, which may be actuated to change (i.e., increase or decrease) the diffraction efficiency of the input grating and, in certain embodiments, change an amount of light totally internally reflected within the waveguide.

Figure 3:
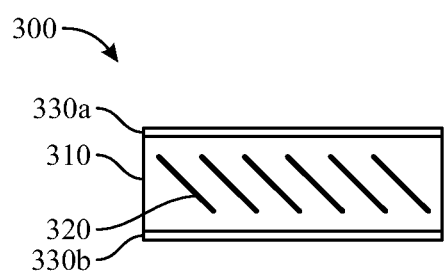
FIG. 3 is a schematic illustration of a nanovoided grating according to certain embodiments.

An example input grating is illustrated schematically in FIG. 3. Grating 300 includes a matrix 310 and regions of nanovoided polymer material 320 dispersed throughout the matrix 310. According to some embodiments, the nanovoided polymer material may be regularly or irregularly dispersed throughout the matrix 310. A primary electrode 330a is disposed over the grating 300 and the grating 300 is disposed over a secondary electrode 330b.

In some embodiments, the matrix material 310 may include an elastomeric material. Example elastomeric materials include a silicone, such as a polydimethylsiloxane (PDMS), or a polymerized monomer such as ethyl acrylate, butyl acrylate, octyl acrylate, ethyethoxy, ethyl acrylate, 2-chloroethyl vinyl ether, chloromethyl acrylate, methacrylic acid, allyl glycidyl ether, or N-methylol acrylamide, poly(ethylene-vinylacetate), poly(ethylene-methylacrylate), poly(ethylene-acrylic acid), poly(ethylene-butylacrylate), poly(ethylene-propylenediene), as well as mixtures or co-polymers thereof. Nanovoided polymer 320 may include one or more of the foregoing elastomeric materials.

Additional examples of curable materials forming electroactive polymers that may be used to form a nanovoided polymer include, without limitation, styrenes, polyesters, polycarbonates, epoxies, halogenated polymers, silicone polymers, and/or other suitable polymer or polymer precursor materials including ethyl acetate, butyl acrylate, octyl acrylate, ethylethoxy ethyl acrylate, 2-chloroethyl vinyl ether, chloromethyl acrylate, methacrylic acid, dimethacrylate oligomers, isocyanates, allyl glycidyl ether, N-methylol acrylamide, or combinations thereof. Such materials, according to some embodiments, may have a dielectric constant or relative permittivity, such as, for example, a dielectric constant ranging from approximately 1.2 to approximately 30.

Various manufacturing methods may be used to form nanovoided polymer materials, such as nanovoided polymer layers or structures having a disordered arrangement of nanovoids or an ordered arrangement of nanovoids. Methods for forming nanovoided polymers having randomly-distributed (i.e., disordered) voids include selectively depositing a polymer composition or a polymeric precursor composition to form voids in situ, or depositing a polymer or polymeric precursor composition containing a templating agent and then selectively removing the templating agent, while a regular (i.e., ordered) arrangement of voids may be formed by self-assembly or various lithography techniques.

In accordance with various embodiments, an example method for fabricating a nanovoided polymer may include (i) depositing a mixture including a curable material and at least one non-curable (e.g., non-polymeric) component onto a substrate, (ii) processing the mixture to form a cured polymer material including at least one non-polymeric component in a plurality of defined regions, and (iii) removing at least a portion of the at least one non-polymeric component from the cured polymer material to form a nanovoided polymer material on the substrate. The substrate may include a waveguide.

In some examples, depositing the mixture may include printing the mixture onto the substrate. Printing may include at least one of inkjet printing or silkscreen printing, for example. In some examples, processing the mixture may include curing the curable material to form the cured polymer material. A curing source and/or heat source, for example, may be used to process the mixture and may include an energized array of filaments that may generate elevated temperatures or actinic energy or both to initiate the curable material. In some embodiments, removing at least the portion of the at least one non-polymeric component from the cured polymer material may lead to the formation of a plurality of voids defined in the nanovoided polymer material.

In some embodiments, the at least one non-curable component may include a solvent. Processing the mixture may include curing the curable material to form the cured polymer material, the cured polymer material including the solvent in the plurality of defined regions. Moreover, removing at least a portion of the at least one non-polymeric component from the cured polymer material may include removing at least a portion of the solvent from the cured polymer material to form the nanovoided polymer material on the substrate.

In some examples, the at least one non-curable component may include a cavitation agent. Further, processing the mixture may include exposing the mixture to light sufficient to cure the curable material and decompose the cavitation agent to form the cured polymer material, the cured polymer material including at least one decomposition product of the cavitation agent in the plurality of defined regions. Further, removing at least the portion of the at least one non-polymeric component from the cured polymer material may include removing at least a portion of the at least one decomposition product from the cured polymer material.

In various embodiments, a method for fabricating a nanovoided polymer may include vaporizing a curable material and depositing the vaporized curable material onto a substrate. The method may further include (i) combining the curable material with at least one non-curable component to form a mixture including the curable material and the at least one non-curable component on the substrate, (ii) processing the mixture to form a cured polymer material including at least one non-polymeric component in a plurality of defined regions, and (iii) removing at least a portion of the at least one non-polymeric component from the cured polymer material to form a nanovoided polymer material on the substrate. In some embodiments, removing at least the portion of the at least one non-polymeric component from the cured polymer material may form a plurality of voids defined in the nanovoided polymer material.

Moreover, (i) vaporizing the curable material may include vaporizing the curable material in a vaporizer, and (ii) depositing the vaporized curable material onto the substrate may include depositing the vaporized curable material while continuously changing the position of the substrate with respect to the vaporizer.

One or more of the foregoing precursor materials may be combined with a suitable solvent, optionally with a chemical curing agent, and dispersed onto a substrate, such as a waveguide. Example solvents include aliphatic, aromatic, or halogenated hydrocarbons, as well as combinations thereof. A curing agent, if provided, may include polyamines, higher fatty acids or their esters, or sulfur, for example.

According to some embodiments, particles of a high refractive index material may be incorporated into the precursor/solvent mixture and thereby incorporated into the nanovoided polymer. Example high refractive index materials include zirconia or titania. The particle size for such materials may be less than 50 nm, e.g., less than 50 nm, less than 20 nm, less than 10 nm, or less than 5 nm, for example.

Referring again to FIG. 3, in some embodiments, grating 300 may be formed by coating a precursor/solvent mixture onto a waveguide, creating a holographic image using an appropriate combination of laser light and initiator, removing the solvent from the coating, and curing the remaining precursor. In some embodiments, various direct-write lithographic methods, such as e-beam lithography or grayscale lithography, may be used to form grating 300. In still further embodiments, a grating may be formed on a substrate other than the waveguide and thereafter transferred to the waveguide.

According to some embodiments, the nanovoided polymer material may be actuated to control the size and shape of the voids within the polymer matrix. Control of the void geometry can be used to control the effective refractive index of the grating and hence the diffraction efficiency.

Figure 4:
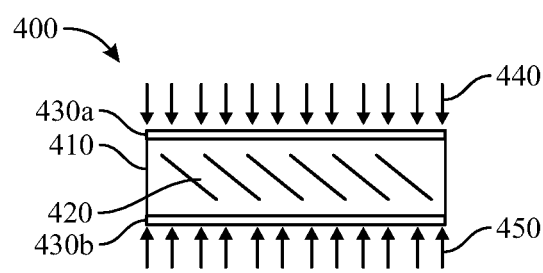
FIG. 4 shows compression of the nanovoided grating of FIG. 3 according to some embodiments.

Referring to FIG. 4, shown schematically is an input grating 400 following actuation by the application of pressure 440, 450 to opposite faces of the input grating. Pressure 440, 450 may include uniaxial compression, or alternate modes including the application of biaxial or shear stress, which may be applied in any suitable dimension to affect the void topology. In some embodiments, the formation of a compressed matrix 410 may decrease the void fraction within the nanovoided polymer 420 and thus increase the effective refractive index of the input grating 400.

In addition to or in lieu of mechanical actuation, according to some embodiments, actuation of the nanovoided polymer may be performed acoustically, hydraulically, pneumatically, or thermally, e.g., using mismatched coefficients of thermal expansion to exert pressure. Alternatively, the void topology may be controlled by capacitive actuation, i.e., by applying a voltage between primary and secondary electrodes 430a, 430b. Thus, various methods in addition to mechanical actuation may be used to actuate a nanovoided layer and impact its effective refractive index by manipulating the topology of the nanovoids therein.

In the presence of an applied electrostatic field, for example, the nanovoided polymer may deform according to the magnitude and direction of the applied field. Generation of such a field may be accomplished by placing the nanovoided polymer between a pair of electrodes, i.e., a primary electrode and a secondary electrode (not shown).

In connection with the various embodiments disclosed herein, the nanovoided polymer-containing input grating 300, 400 may be disposed over, e.g., directly over, a primary electrode, and a secondary electrode may be disposed over, e.g., directly over, the grating 300, 400. In some embodiments, the electrodes may include metals such as aluminum, gold, silver, tin, copper, indium, gallium, zinc, and the like. Other conductive materials may be used, including carbon nanotubes, graphene, transparent conductive oxides (TCOs, e.g., indium tin oxide (ITO), zinc oxide (ZnO), etc.), and the like.

In some embodiments, transparent electrodes may be disposed at the interface between an input grating and an adjacent waveguide, as well as at the opposing surface of the input grating, and an electrical voltage may be applied to create electrostatic forces, compressing the input grating.

The primary electrode and the secondary electrode may be fabricated using any suitable process. For example, the electrodes may be fabricated using physical vapor deposition (PVD), chemical vapor deposition (CVD), evaporation, spray-coating, spin-coating, atomic layer deposition (ALD), and the like. In further aspects, the electrodes may be manufactured using a thermal evaporator, a sputtering system, a spray coater, a spin-coater, printing, stamping, and the like. In some embodiments, the electrodes may be conformally disposed over respective lower and upper surfaces of the grating 300, 400.

In some embodiments, the electrodes may have a thickness of approximately 1 nm to approximately 1000 nm, with an example thickness of approximately 10 nm to approximately 50 nm. The electrodes in certain embodiments may have an optical transmissivity of at least approximately 50%, e.g., approximately 50%, approximately 60%, approximately 70%, approximately 80%, approximately 90%, approximately 95%, approximately 97%, approximately 98%, or approximately 99%, including ranges between any of the foregoing values.

The electrodes may be designed to allow healing of electrical breakdown (e.g., associated with the electric breakdown of elastomeric polymer materials). A thickness of an electrode that includes a self-healing electrode (e.g., an aluminum electrode) may be approximately 20 nm. The electrodes may be configured to stretch elastically. In such embodiments, the electrodes may include TCOs, graphene, carbon nanotubes, and the like. In other embodiments, relatively rigid electrodes (e.g., electrodes including a metal such as aluminum) may be used.

Figure 5:
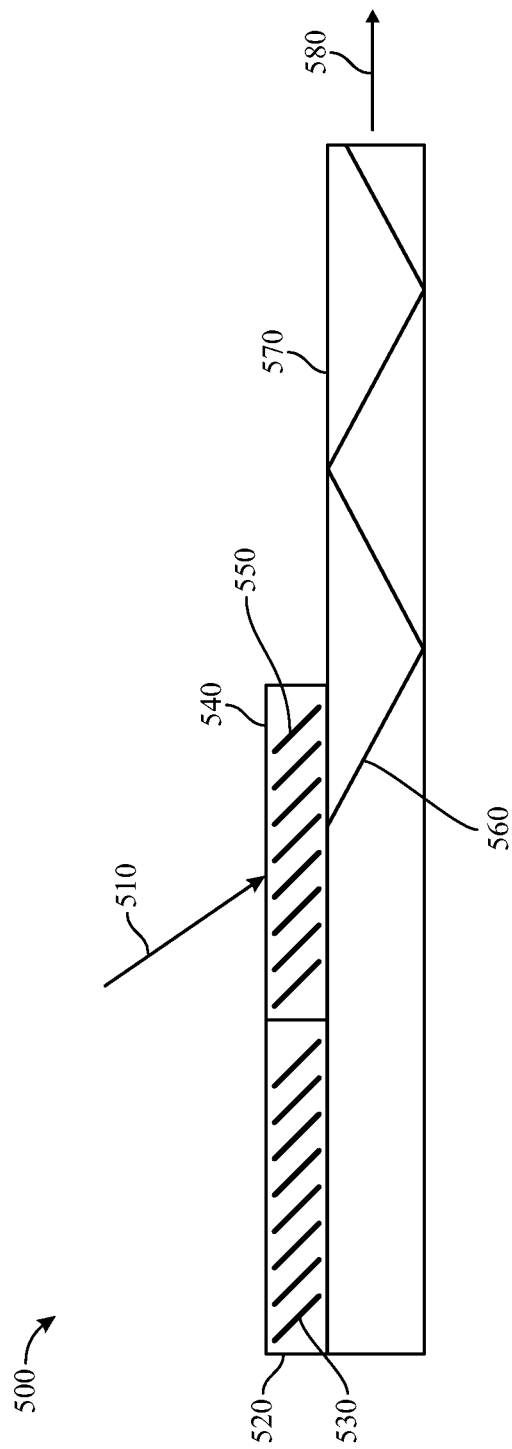
FIG. 5 shows a scanned projector coupling to a waveguide through the near-side region of an input grating and the associated reflected light path according to some embodiments.

Referring to FIG. 5, illustrated is the input region of a waveguide display 500 during an example mode of operation, where a scanned projector (not shown) directs a ray bundle 510 toward first and second input gratings 520, 540, which may be optically coupled to waveguide 570. The first input grating 520 may be disposed over an end region of the waveguide 570, and the second input grating 540 may be disposed adjacent to the first input grating 520. Waveguide 570 may be a planar waveguide, for example. In accordance with various embodiments, first and second input gratings 520, 540 may be co-extensive and may include nanovoided regions 530, 550, respectively.

In the illustrated mode of operation, ray bundle 510 may be at least partially diffracted by the second (i.e., near-side) input grating 540, forming diffracted ray bundle 560, which may be totally internally reflected within waveguide 570 along a direction 580 and toward an output grating (not shown). It will be appreciated that diffracted ray bundle 560 may be internally reflected within waveguide 570 without interacting with the first (i.e., far-side) input grating 520 or the second input grating 540, thus foregoing the formation of an undesired ray bundle.

Figure 6:
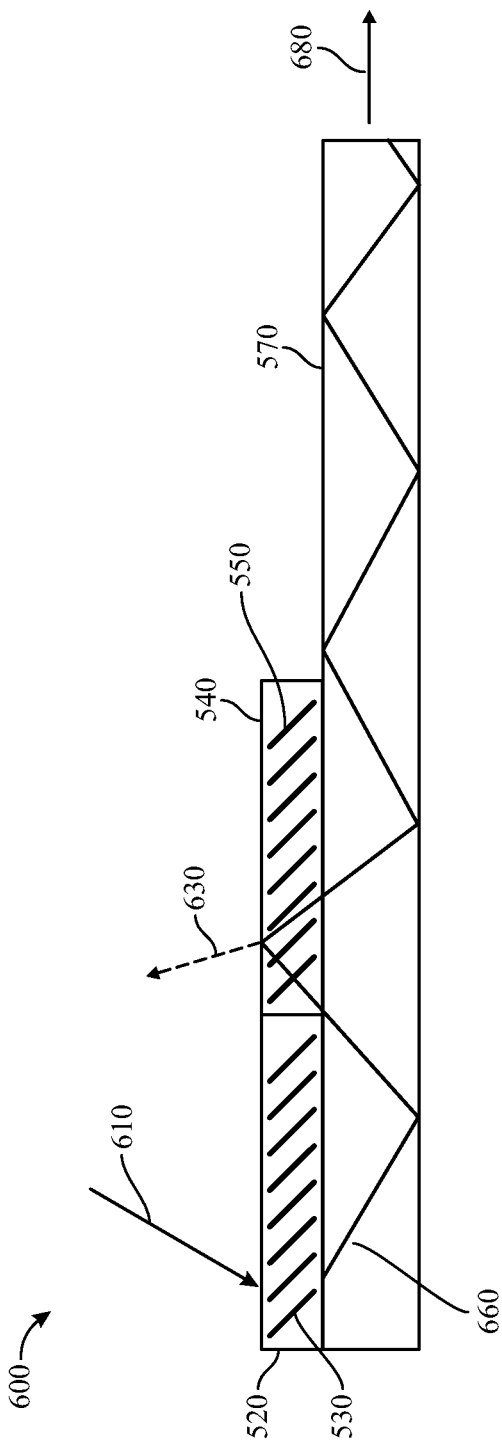
FIG. 6 shows a scanned projector coupling to a waveguide through the far-side region of an input grating and the associated reflected light path according to some embodiments.

Turning to FIG. 6, illustrated is waveguide display 600 during a different mode of operation. In the embodiment of FIG. 6, the scanned projector (not shown) directs a ray bundle 610 toward first and second nanovoided input gratings 520, 540 of waveguide 570 at a scan angle or wavelength different from the scan angle or wavelength of the FIG. 5 embodiment.

In the illustrated mode of operation, projected ray bundle 610 may be at least partially diffracted by first (i.e., far-side) grating 520, forming diffracted ray bundle 660, which may be totally internally reflected within waveguide 570 along a direction 680 and toward an output grating (not shown). However, because of the scan angle or wavelength of projected ray bundle 610, a portion of diffracted ray bundle 660 may interact with second input grating 540 and may be extracted out of the waveguide 570, forming undesired ray bundle 630. The loss of a portion of diffracted ray bundle 660 and the attendant formation of undesired ray bundle 630 may decrease the efficiency of the waveguide.

Figure 7:
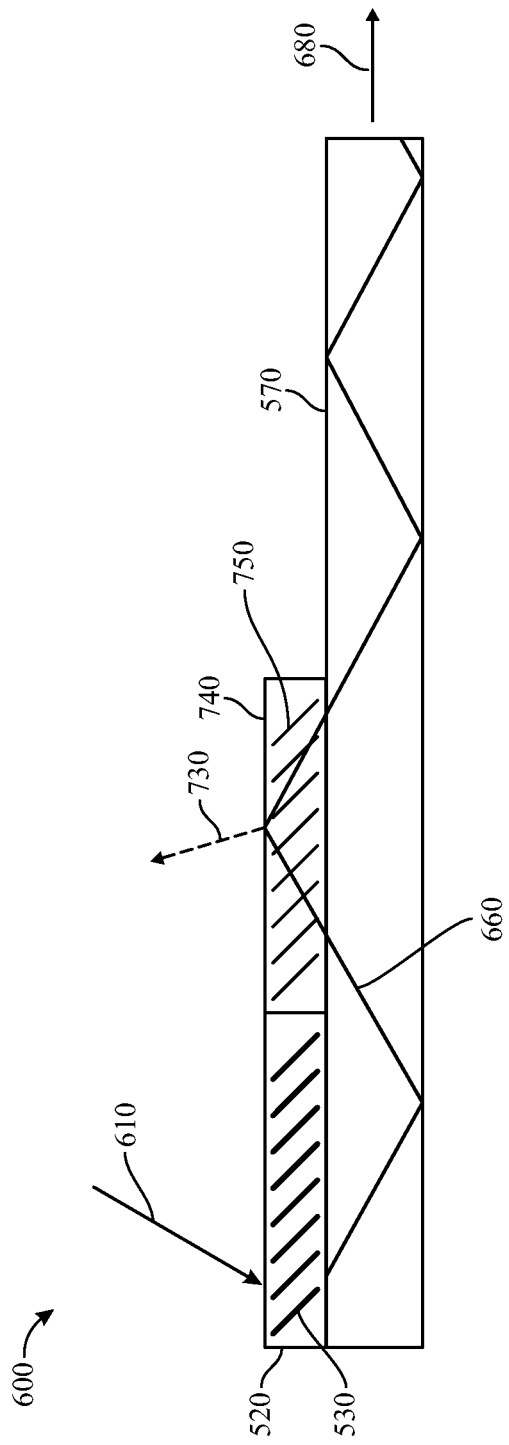
FIG. 7 shows a scanned projector coupling to a waveguide through the far-side region of an input grating and the associated reflected light path following actuation of the near-side region of the input grating according to some embodiments.

FIG. 7 shows the waveguide display 600 of FIG. 6 following actuation of the nanovoided region 550 within the second input grating 540 to form an actuated nanovoided region 750 within actuated second input grating 740. Actuation (i.e., compression) of the nanovoided region 550 may alter the void topology, i.e., decrease the void fraction, within the second input grating 540 thereby decreasing the diffraction efficiency of the near-side grating 740 and decreasing the amount of optical loss associated with undesired ray bundle 730. This may result in an increase in the efficiency of the waveguide display 600.

Furthermore, according to certain embodiments, actuation of the nanovoided region 550 may be reversible. Thus, one or more input gratings may be independently compressed and decompressed to desirably change the corresponding grating efficiency as an image is formed by scanning light across the input gratings.

Figure 8:
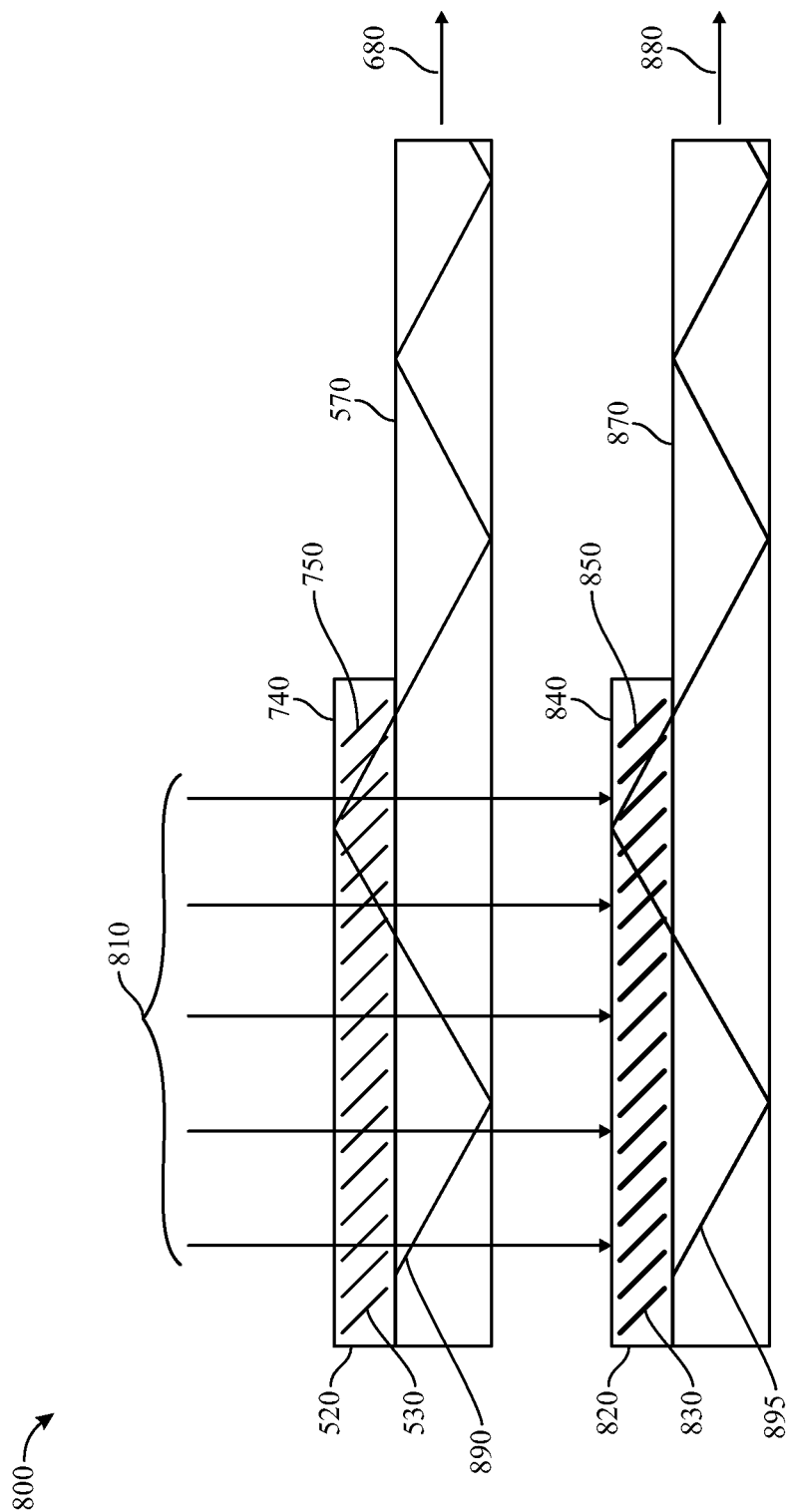
FIG. 8 shows the interaction of input light on stacked primary and secondary waveguides with the input grating for the primary waveguide actuated and the input grating for the secondary waveguide un-actuated according to some embodiments.
Figure 9:
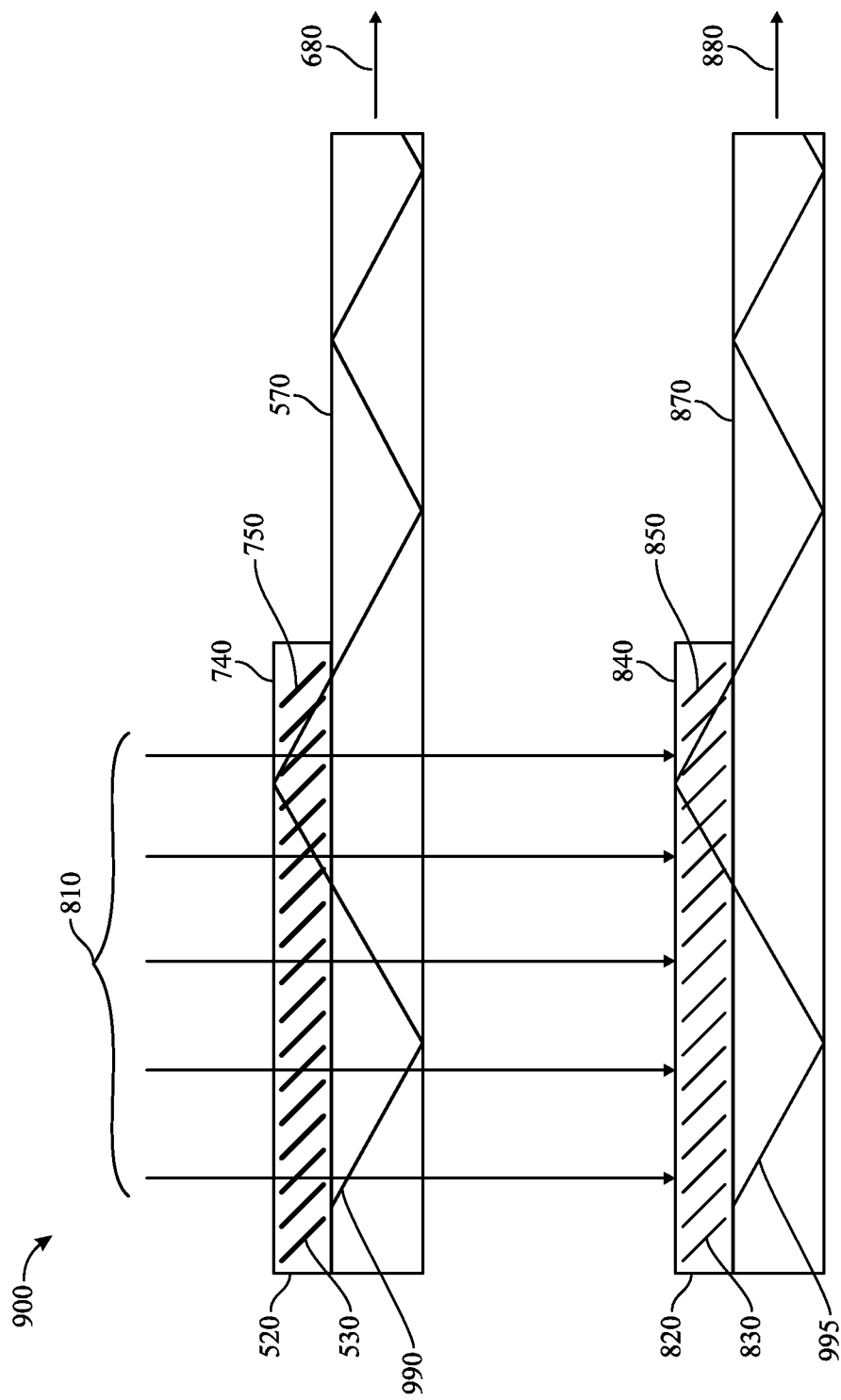
FIG. 9 shows the interaction of input light on stacked primary and secondary waveguides with the input grating for the primary waveguide un-actuated and the input grating for the secondary waveguide actuated according to some embodiments.

Referring to FIGS. 8 and 9, according to further embodiments, shown is a stacked waveguide display incorporating at least one nanovoided polymer-containing input grating. Stacked waveguide display 800 includes a primary waveguide 570 overlying a secondary waveguide 870. Primary and secondary waveguide 570, 870 may each include a planar waveguide. A scanned projector (not shown) is configured to emit a ray bundle 810 into each of a first primary input grating 520 and a second primary input grating 740 that overlie primary waveguide 570, and a first secondary input grating 820 and a second secondary input grating 840 that overlie secondary waveguide 870. The first primary input grating 520 and the second primary input grating 740 may be optically coupled to the primary waveguide 570, and the first secondary input grating 820 and the second secondary input grating 840 may be optically coupled to the secondary waveguide 870. As illustrated, the first (i.e., far-side) primary input grating 520 and the first (i.e., far-side) secondary input grating 820 may be disposed over respective end regions of waveguides 570, 870, while the second (i.e., near-side) primary input grating 740 and the second (i.e., near-side) secondary input grating 840 are disposed adjacent, i.e., immediately adjacent, to the respective first input gratings 520, 820. Waveguides 570, 870 are configured to relay optically-transmitted information contained in ray bundle 810, e.g., image information, by total internal reflection (TIR).

For the sake of clarity, in the illustrated embodiment, projected ray bundle (image input) 810 may be characterized by a single incident angle or wavelength although, as will be appreciated, a range of incident angles or wavelengths (not shown) may be used to form a desired image.

In accordance with various embodiments, first and second primary input gratings 520, 740 may include nanovoided regions 530, 750, respectively, while first and second secondary input gratings 820, 840 may respectively include nanovoided regions 830, 850.

First and second primary input gratings 520, 740 may couple at least a portion of the projected light 810 into the primary waveguide 570 forming a primary diffracted ray bundle 890, and first and second secondary input gratings 830, 840 may couple at least a portion of the projected light 810 into the secondary waveguide 870 forming a secondary diffracted ray bundle 895.

Illustrated in FIG. 8 is a mode of operation according to certain embodiments where primary input gratings 520, 740 are in a compressed (i.e., actuated) state, such that there is relatively little diffraction of projected light 810 forming diffracted ray bundle 890 in primary waveguide 570, whereas secondary input gratings 820, 840 are un-actuated and therefore diffract a relatively large fraction of projected light 810 forming diffracted ray bundle 895.

Diffracted ray bundles 890, 895 may be totally internally reflected within respective waveguides 570, 870 along directions 680, 880 toward a corresponding output grating (not shown).

The configuration shown in FIG. 8 may be used, for example, in field sequential illumination systems, where one color or set of colors may be coupled initially into a waveguide, such as secondary waveguide 870, with an output grating that is designed for that color or set of colors, then the waveguide input gratings can be switched to couple a different color or set of colors to a different waveguide, such as primary waveguide 570.

An alternate configuration is illustrated in FIG. 9, where stacked waveguide display 900 includes un-actuated first and second primary input gratings 520, 740 and actuated first and second secondary input gratings 820, 840, such that a relatively large fraction of projected light 810 is diffracted by first and second primary input gratings 520, 740 to form diffracted ray bundle 990, whereas a relatively small fraction of projected light 810 is diffracted by first and second secondary input gratings 820, 840 to form diffracted ray bundle 995.

Diffracted ray bundles 990, 995 may be totally internally reflected within respective primary and secondary waveguides 570, 870 along directions 680, 880 toward a corresponding output grating (not shown).

Figure 10:
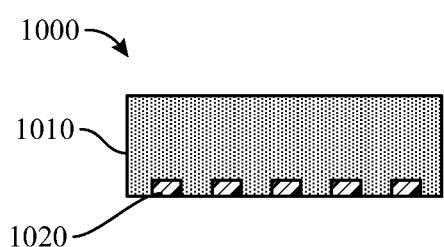
FIG. 10 is a schematic illustration of a nanovoided grating according to certain embodiments.
Figure 11:
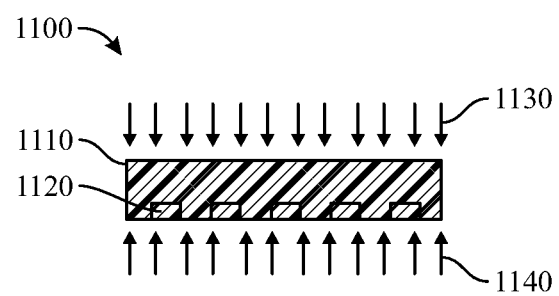
FIG. 11 shows compression of the nanovoided grating of FIG. 10 according to some embodiments.

Referring to FIGS. 10 and 11, illustrated are example grating geometries according to further embodiments. As shown in FIG. 10, input grating 1000 includes a nanovoided polymer layer 1010 having an inlaid, i.e., surface or near-surface, grating structure 1020 disposed within a lower surface thereof. In some embodiments, nanovoided polymer layer 1010 may have a first refractive index and grating structure 1020 may have a second refractive index different from the first refractive index.

In conjunction with the foregoing architecture, in some embodiments, nanovoided polymer layer 1010 may be less compressible than grating structure 1020. In such a case, the nanovoided polymer layer 1010 may have a refractive index greater than the grating structure when input grating 1000 is uncompressed. In further embodiments, nanovoided polymer layer 1010 may be more compressible than grating structure 1020. In such a case, the nanovoided polymer layer 1010 may have a refractive index less than the grating structure when input grating 1000 is uncompressed.

In some embodiments, pressure 1130, 1140 may be applied to grating 1000 to form compressed grating 1100 as shown in FIG. 11 such that, according to some embodiments, a difference in the refractive index between compressed nanovoided polymer layer 1110 and compressed grating structure 1120 is less than the difference in the refractive index between nanovoided polymer layer 1010 and grating structure 1020 prior to actuation (see FIG. 10).

Figure 12:
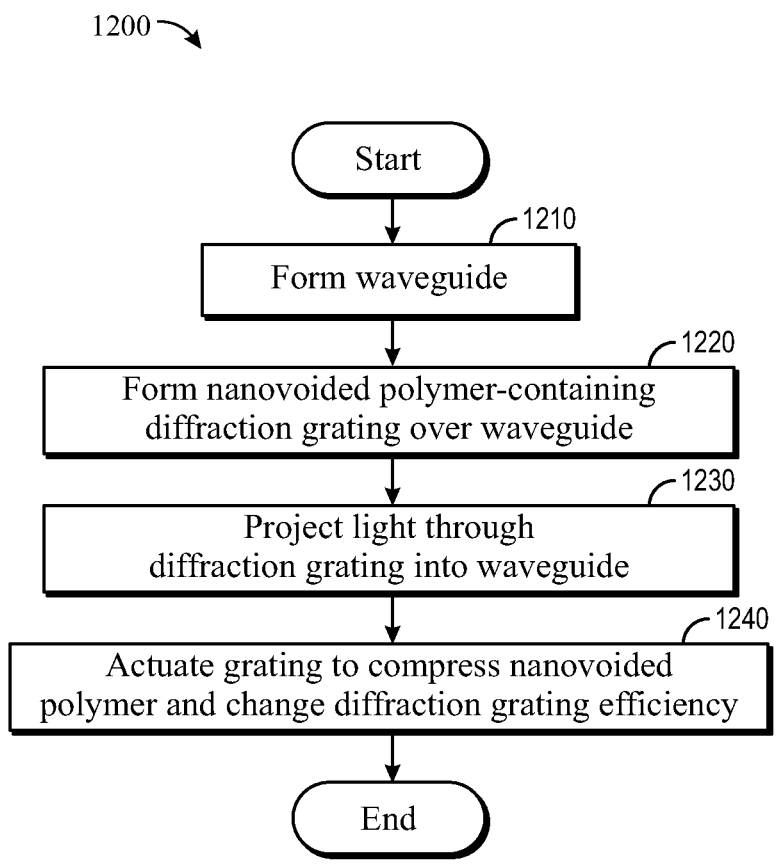
FIG. 12 is a flowchart detailing an example method of forming and operating a display device having a nanovoided polymer-containing diffraction grating.

With reference now to FIG. 12, shown is a flowchart detailing an example method of forming and operating a display device having a nanovoided polymer-containing diffraction grating. The method 1200 includes, at step 1210, the formation of a waveguide and, at step 1220, the formation over the waveguide of a diffraction grating for dispersing a beam of light at a plurality of angles into the waveguide. At least a portion of the diffraction grating includes a nanovoided polymer. At step 1230, a beam of light is projected through the diffraction grating and into the waveguide. At step 1240, the diffraction grating may be actuated and the nanovoided polymer compressed to change an amount of the dispersed light totally internally reflected within the waveguide.

The foregoing structures and methods describe the formation and operation of waveguide displays having a tunable input grating. The input grating may include one or more nanovoided polymer layers that may be actuated to reversibly control the effective refractive index and hence the diffraction efficiency of the input grating. Such gratings may be used to decrease optical losses in various waveguide display devices.

Embodiments of the present disclosure may include or be implemented in conjunction with an artificial reality system. Artificial reality is a form of perceived reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in artificial reality and/or are otherwise used (e.g., perform activities) in artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A display device comprising: a scanned projector for projecting a beam of light; and a diffraction grating for dispersing the beam of light at a plurality of angles into a waveguide, wherein at least a portion of the diffraction grating comprises a nanovoided polymer, wherein compression of the nanovoided polymer changes an amount of the beam of light totally internally reflected within the waveguide.

2. The display device of claim 1, wherein the diffraction grating is optically coupled to the waveguide.

3. The display device of claim 1, wherein the diffraction grating comprises:
a far-side region overlying an end region of the waveguide; and
a near-side region overlying the waveguide and laterally adjacent to the far-side region,
wherein at least one of the far-side region and the near-side region comprises the nanovoided polymer.

4. The display device of claim 3, wherein both the far-side region and the near-side region comprise the nanovoided polymer.

5. The display device of claim 1, wherein compression of the nanovoided polymer changes a diffraction efficiency of the diffraction grating.

6. The display device of claim 1, wherein compression of the nanovoided polymer decreases a diffraction efficiency of the diffraction grating.

7. The display device of claim 1, wherein a diffraction efficiency of the diffraction grating is reversibly changeable.

8. The display device of claim 1, wherein the waveguide comprises a planar waveguide.

9. The display device of claim 1, further comprising:
a primary electrode; and
a secondary electrode overlapping at least a portion of the primary electrode; wherein
the portion of the diffraction grating comprising the nanovoided polymer is disposed between and abuts the primary electrode and the secondary electrode.

10. A display device comprising: an optical waveguide; and a diffraction grating for dispersing a projected beam of light at a plurality of angles into the waveguide, wherein at least a portion of the diffraction grating comprises a nanovoided polymer, wherein compression of the waveguide.

11. The display device of claim 10, wherein the diffraction grating comprises:
a far-side region overlying an end region of the waveguide; and
a near-side region overlying the waveguide and laterally adjacent to the far-side region,
wherein at least one of the far-side region and the near-side region comprises the nanovoided polymer.

12. The display device of claim 11, wherein both the far-side region and the near-side region comprise the nanovoided polymer.

13. The display device of claim 10, wherein compression of the nanovoided polymer changes a diffraction efficiency of the diffraction grating.

14. The display device of claim 10, wherein compression of the nanovoided polymer decreases a diffraction efficiency of the diffraction grating.

15. The display device of claim 10, wherein a diffraction efficiency of the diffraction grating is reversibly changeable.

16. The display device of claim 10, wherein the waveguide comprises a planar waveguide.

17. The display device of claim 10, further comprising:
a primary electrode; and
a secondary electrode overlapping at least a portion of the primary electrode; wherein
the nanovoided polymer is disposed between and abuts the primary electrode and the secondary electrode.

18. A method comprising:
forming a waveguide;
forming a diffraction grating for dispersing a beam of light at a plurality of angles into the waveguide, wherein at least a portion of the diffraction grating comprises a nanovoided polymer; and
compressing the nanovoided polymer to change an amount of the dispersed light totally internally reflected within the waveguide.

* * * * *

UNITED STATES PATENT AND TRADEMARK OFFICE
CERTIFICATE OF CORRECTION

PATENT NO. : 11,022,856 B1
APPLICATION NO. : 16/263829
DATED : June 1, 2021
INVENTOR(S) : Andrew John Ouderkirk et al.

Page 1 of 1

It is certified that error appears in the above-identified patent and that said Letters Patent is hereby corrected as shown below:

In the Claims

Claim 10, at Column 16, Line 2 should read:
nanovoided polymer, wherein compression of the nanovoided polymer changes an amount of the beam of light totally internally reflected within the waveguide.

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*